United States Patent
Ono et al.

(10) Patent No.: US 6,229,728 B1
(45) Date of Patent: *May 8, 2001

(54) FERROELECTRIC MEMORY AND METHOD OF TESTING THE SAME

(75) Inventors: Chikai Ono; Hirokazu Yamazaki, both of Kawasaki (JP)

(73) Assignee: Fujitu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/296,544

(22) Filed: Apr. 22, 1999

(30) Foreign Application Priority Data

Aug. 25, 1998 (JP) ................................... 10-237860

(51) Int. Cl.[7] ..................................... G11C 11/22
(52) U.S. Cl. ........................... 365/145; 365/190; 365/210
(58) Field of Search ..................................... 365/145, 190, 365/210, 203

(56) References Cited

U.S. PATENT DOCUMENTS

| 5,515,312 | * | 5/1996 | Nakakuma et al. | 365/145 |
| 5,517,445 | * | 5/1996 | Imai et al. | 365/145 |
| 5,663,904 | * | 9/1997 | Arase | 365/145 |
| 5,844,831 | * | 12/1998 | Nishimura | 365/145 |
| 5,844,832 | * | 12/1998 | Kim | 365/145 |

FOREIGN PATENT DOCUMENTS

| 3-283176 | 12/1991 | (JP) . |
| 8-203266 | 8/1996 | (JP) . |

* cited by examiner

Primary Examiner—Son Mai
(74) Attorney, Agent, or Firm—Arent Fox Kintner Plotkin & Kahn PLLC

(57) ABSTRACT

A ferroelectric memory includes memory cells, a pair of bit lines to which the memory cells are connected, and a control circuit which changes a reference cell applied to one of the pair of bit lines while data read from one of the memory cells is output to the other one of the pair of bit lines.

8 Claims, 13 Drawing Sheets

FERROELECTRIC MEMORY AND METHOD OF TESTING THE SAME

BACKGROUND OF THE INVENTION

1. Field of the Invention

The present invention generally relates to a ferroelectric memory and a method of testing a ferroelectric memory.

2. Description of the Related Art

FIG. 1 is a circuit diagram of a memory cell of a one-transistor/one-capacitor type, which is an example of memory cells of a ferroelectric memory. In FIG. 1, WL denotes a word line, PL denotes a plate line, BL denotes a bit line, Cbit denotes a parasitic capacitor, 1 indicates a ferroelectric capacitor, and 2 indicates an n-channel MOS (nMOS) transistor functioning as a switch element.

Data is written into the memory cell as follows. The word line WL is selected and the nMOS transistor 2 is thus turned on. Then, an electric field is applied to the ferroelectric capacitor 1 using the bit line BL and the plate line PL.

For example, data "1" is written into the memory cell, a potential VBL of the bit line BL is set higher than a potential VPL of the plate line PL in the state in which the nMOS transistor 2 is in the ON state. Hence, a remanent polarization oriented downwards in the figure from the bit line BL to the plate line PL remains. In contrast, data "0" is written into the memory cell, the potential VBL of the bit line BL is set lower than the potential VPL of the plate line PL in the state in which the nMOS transistor 2 is in the ON state. Hence, a remanent polarization oriented upwards in the figure from the plate line PL to the bit line BL remains.

The above memory operation can be represented as a hysteresis characteristic of the ferroelectric capacitor 1 shown in FIG. 2. The horizontal axis of the graph of FIG. 2 denotes a voltage V applied across the ferroelectric capacitor 1, and is defined such that V=VPL−VBL. The vertical axis of the graph denotes polarization. The plus side of the vertical axis is defined as an upward polarization, and the minus side thereof is defined as a downward polarization.

Hence, a minus remanent polarization −Ps remains when the electric field applied across the ferroelectric capacitor 1 is zero (when VPL=VBL) corresponds to a state in which data "1" is stored, and a plus remanent polarization Ps corresponds to a state in which data "0" is stored.

Data is read from the memory cell shown in FIG. 1 as follows. The bit line BL is precharged to 0 V so as to be set in a high-impedance state. Next, the word line WL is selected to turn on the nMOS transistor 2. Then, the potential of the plate line PL is changed to a power supply voltage VCC from 0 V. Hence, a charge dependent on the state of polarization of the ferroelectric capacitor 1 is moved from the ferroelectric capacitor 1 to the bit line BL. Thus, the original charge is divided into parts respectively stored in the ferroelectric capacitor 1 and the parasitic capacitor Cbit. Thus, a potential VBL0 or VBL1 dependent on the stored data "0" or "1" appears on the bit line BL.

FIG. 3 is a graph of the levels of the potentials VBL0 and VBL1 of the bit line BL. When the memory cell shown in FIG. 1 stores data "0", the potential VBL0 of the bit line BL can be obtained from the cross point at which the curve of the hysteresis characteristic of the ferroelectric capacitor 1 and a load line L0 of the parasitic capacitor Cbit of the bit line BL cross each other.

In contrast, when the memory cell shown in FIG. 1 stores data "1", the potential VBL1 of the bit line BL can be obtained from the cross point at which the curve of the hysteresis characteristic of the ferroelectric capacitor 1 and a load line L1 of the parasitic capacitor Cbit of the bit line BL cross each other.

When the stored data is "0", the polarized state of the ferroelectric capacitor 1 is maintained after the data is read out. In contrast, when the stored data is 1, the polarization of the ferroelectric capacitor 1 is inverted, so that rewriting of the data is needed. The data write can automatically be performed by a sense amplifier as in the case of a DRAM (Dynamic Random Access Memory).

FIG. 4 is a circuit diagram of a part of a cell array of a conventional ferroelectric memory equipped with one-capacitor/one-transistor type memory cells. In FIG. 4, WLon and WLen respectively denote word lines, PLcn denotes a plate line, BLn and /BLn respectively denote bit lines, 3 and 4 respectively indicate memory cells, 5 and 6 respectively ferroelectric capacitors serving as recording media, and 7 and 8 respectively nMOS transistors serving as switch elements. Further, RWLo and RWLe respectively denote word lines, RPLc denotes a plate line, 9 indicates a reference cell which outputs a reference potential Vref to the bit line /BLn, 10 indicates a reference cell which outputs the reference potential Vref to the bit line BLn, and 11 indicates a sense amplifier which amplifies the potential difference between the bit lines BLn and /BLn and thus detects the stored data read out from the selected memory cell.

The stored data read out to the bit line BLn is compared with the reference potential Vref output to the bit line /BLn from the reference cell 9, and the logical value thereof is thus decided. The stored data read out to the bit line /BLn is compared with the reference potential Vref output to the bit line BLn from the reference cell 10, and the logical value thereof is thus decided.

FIG. 5 is a circuit diagram of the conventional reference cell. In FIG. 5, RWL denotes a word line, RPL denotes a plate line, BL denotes a bit line, Cbit denotes a parasitic capacitor of the bit line BL, 12 indicates a ferroelectric capacitor having a larger area than the ferroelectric capacitor of the memory cell, and 13 indicates an nMOS transistor serving as a switch element.

When the reference cell shown in FIG. 5 is used, data "0" is written into the ferroelectric capacitor 12 in which an upward remanent polarization oriented upward in the figure remains. When the reference potential Vref is generated, the bit line BL is precharged to 0 V and is set to the high-impedance state. Then, the word line RWL is selected and the nMOS transistor 13 is turned on. Hence, the plate line PL is set to the power supply potential VCC from 0 V.

With the above operation, a charge dependent on the magnitude of the remanent polarization of the ferroelectric capacitor 12 is moved to the bit line BL from the ferroelectric capacitor 12. Thus, the total charge is divided into parts respectively stored in the ferroelectric capacitor 12 and the parasitic capacitor Cbit of the bit line BL. Hence, the reference potential Vref appears on the bit line BL.

FIG. 6 is a graph showing the level of the reference potential Vref output by the reference cell shown in FIG. 5. The level of the reference cell Vref can be obtained from the cross point at which the curve of the hysteresis characteristic of the ferroelectric capacitor 12 and a load line RL0 of the parasitic capacitor Cbit of the bit line BL cross each other.

FIG. 7 shows another configuration of the reference cell. In FIG. 7, RWL denotes a word line, RPL denotes a plate line, BL denotes a bit line, Cbit denotes a parasitic capacitor of the bit line BL, 14 indicates a ferroelectric capacitor having a larger area than the ferroelectric capacitor of the memory cell, 15 indicates an nMOS transistor serving as a switch element, 16 indicates a p-channel (pMOS) transistor serving as a switch element, 17 is a VCC line, and PCL denotes a precharge control line.

When the reference cell shown in FIG. 7 is used, the pMOS transistor 16 is maintained in the on state by controlling the precharge control line PCL during a non-selected state. Hence, a node 18 is precharged to the power supply potential VCC, and a downward remanent polarization in the figure is generated in the parasitic capacitor 14.

When the reference voltage Vref is generated, the bit line BL is precharged to 0 V, and is set to the high-impedance state. Further, the pMOS transistor 16 is turned off, and the word line RWL is selected with the plate line RPL maintained at 0 V. Hence, the nMOS transistor 15 is turned on. Hence, a charge dependent on the magnitude of polarization of the ferroelectric capacitor 14 is moved to the bit line BL from the ferroelectric capacitor 14. Thus, the original charge is divided into parts respectively stored in the ferroelectric capacitor 14 and the parasitic capacitor Cbit of the bit line BL. Hence, the reference potential Vref is generated on the bit line BL.

FIG. 8 is a graph showing the level of the reference potential Vref generated by the reference cell shown in FIG. 7. The level of the reference potential Vref can be obtained from the cross point at which the curve of the hysteresis characteristic of the ferroelectric capacitor 14 and a load line RL1 of the parasitic capacitor Cbit of the bit line BL cross each other.

FIG. 9 shows an ideal relationship among the reference potential output by the reference cell, the potential VBL1 of the bit line BL obtained when "1" is read from the memory cell, and the potential VBL0 of the bit line BL obtained when "0" is read from the memory cell.

However, as shown in FIG. 10, the actual level of the potential VBL1 is dispersed in a range illustrated with hatching, and the actual level of the potential VBL0 is dispersed in a range illustrated with hatching. The above dispersion of the potentials VBL1 and VBL0 depends on the characteristic of the memory cell.

In the conventional ferroelectric memory equipped with the one-transistor/one-capacitor memory cells, there is no means for checking margins of the potentials VBL1 and VBL0 of the bit line BL with respect to the reference potential Vref. Hence, it is very difficult to determine whether the products which have passed a shipping inspection have margins of the potentials VBL1 and VBL0 exceeding the respective worst margins. Hence, products of low reliability may be shipped. It is also difficult to determine whether faulty products rejected in the shipping inspection result from a failure of the margins or another factor, such as a problem in a production process and to thus perform a failure analysis efficiently.

SUMMARY OF THE INVENTION

It is a general object of the present invention to provide a ferroelectric memory and a method of testing the same, in which the above disadvantages are eliminated.

A more specific object of the present invention is to provide a highly reliable ferroelectric memory and a method of efficiently testing such a ferroelectric memory with ease.

The above objects of the present invention are achieved by a ferroelectric memory comprising: first and second bit lines to which memory cells are connected; a first reference cell which is connected to the second bit line and outputs a reference potential to the second bit line when the memory cells connected to the first bit line are selected; a second reference cell which is connected to the first bit line and outputs the reference potential to the first bit line when the memory cells connected to the second bit line are selected; and a sense amplifier which amplifies a potential difference between the first and second bit lines and detects data output to one of the first and second bit lines from a selected memory cell. The ferroelectric memory includes a reference potential control circuit which controls the first and second reference cells to thereby change the reference potential.

The above objects of the present invention are achieved by a ferroelectric memory comprising: memory cells; a pair of bit lines to which the memory cells are connected; and a control circuit which changes a reference cell applied to one of the pair of bit lines while data read from one of the memory cells is output to the other one of the pair of bit lines.

The above objects of the present invention are also achieved by a method of testing a ferroelectric memory in which data read from a memory cell is detected by a potential difference between a pair of bit lines, while one of the pair of bit lines is supplied with a reference potential and the data is read to the other one of the pair of bit lines, the method comprising the steps of: changing the reference voltages; and detecting potential margins of the pair of bit lines on the basis of data obtained while changing the reference potential.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
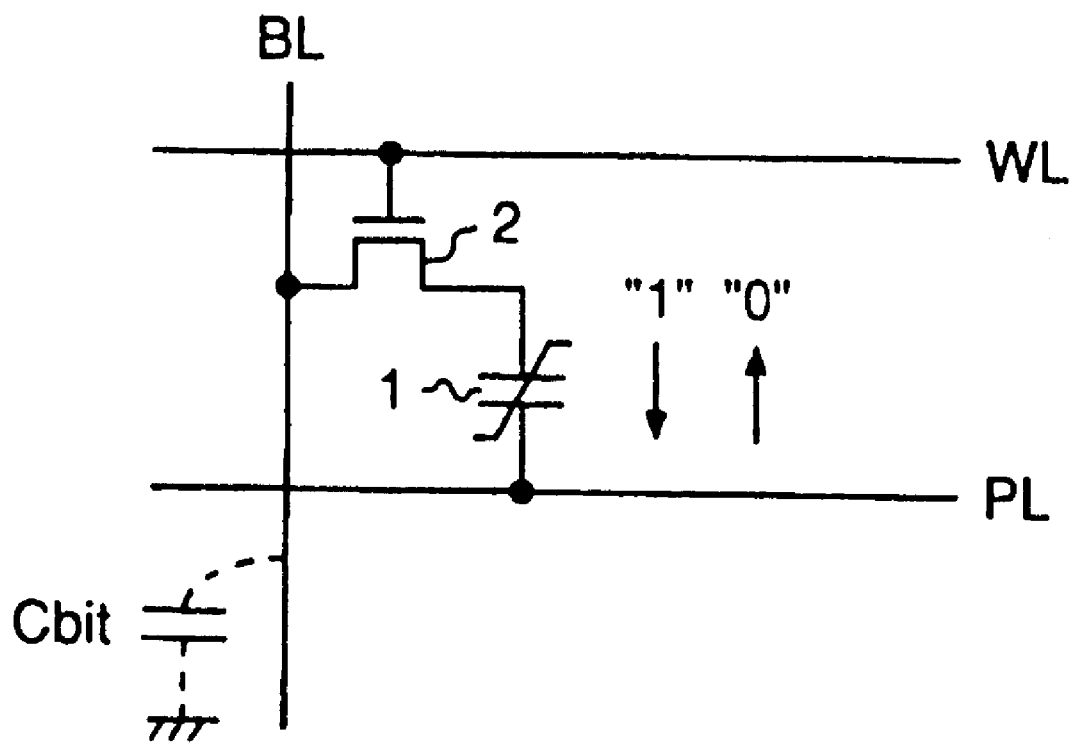
FIG. 1 is a circuit diagram of a one-transistor/one-capacitor memory cell.
Figure 2:
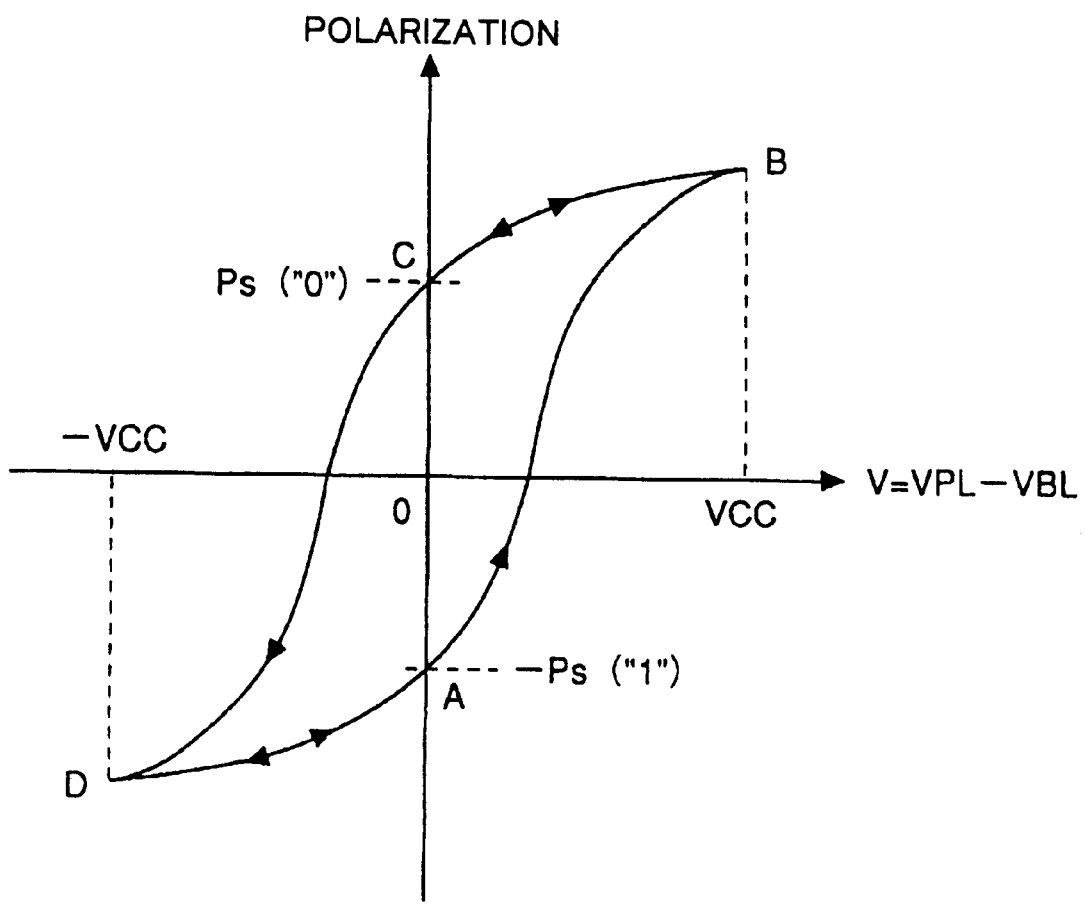
FIG. 2 is a graph of a hysteresis characteristic of a ferroelectric capacitor used in FIG. 1.
Figure 3:
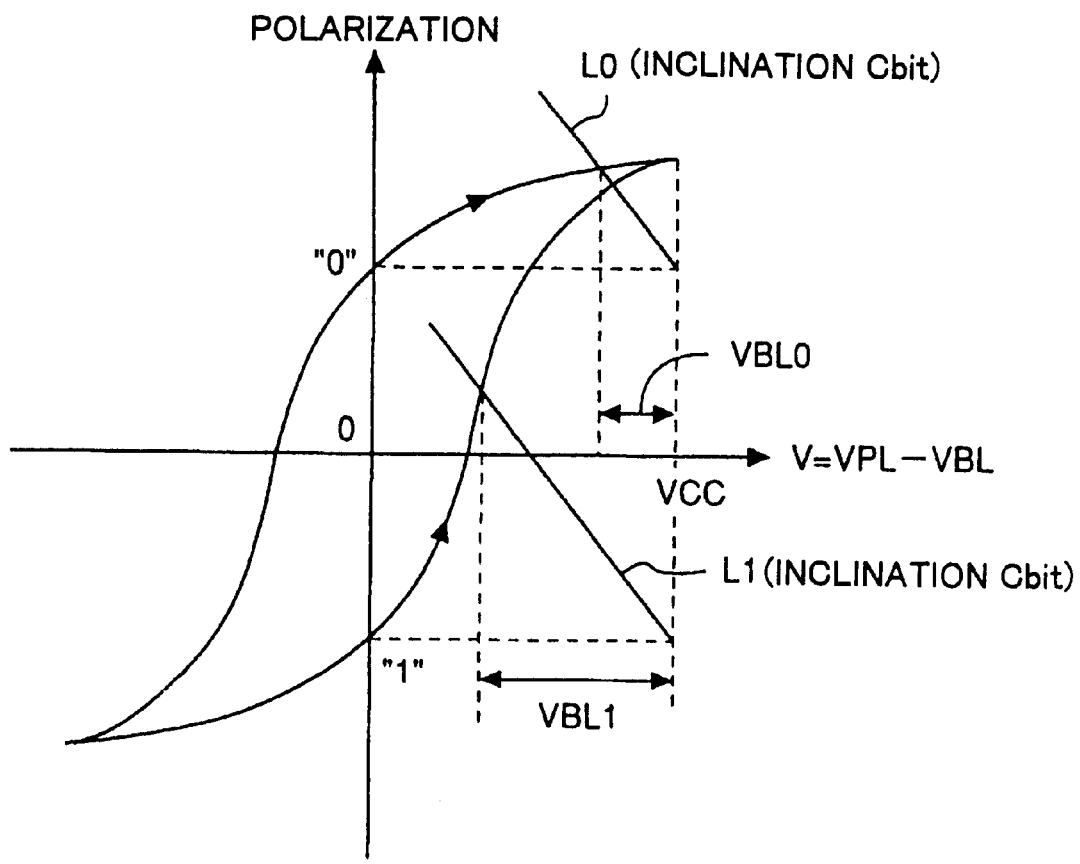
FIG. 3 is a graph of levels of potentials VBL0 and VBL1 of a bit line shown in FIG. 1.
Figure 4:
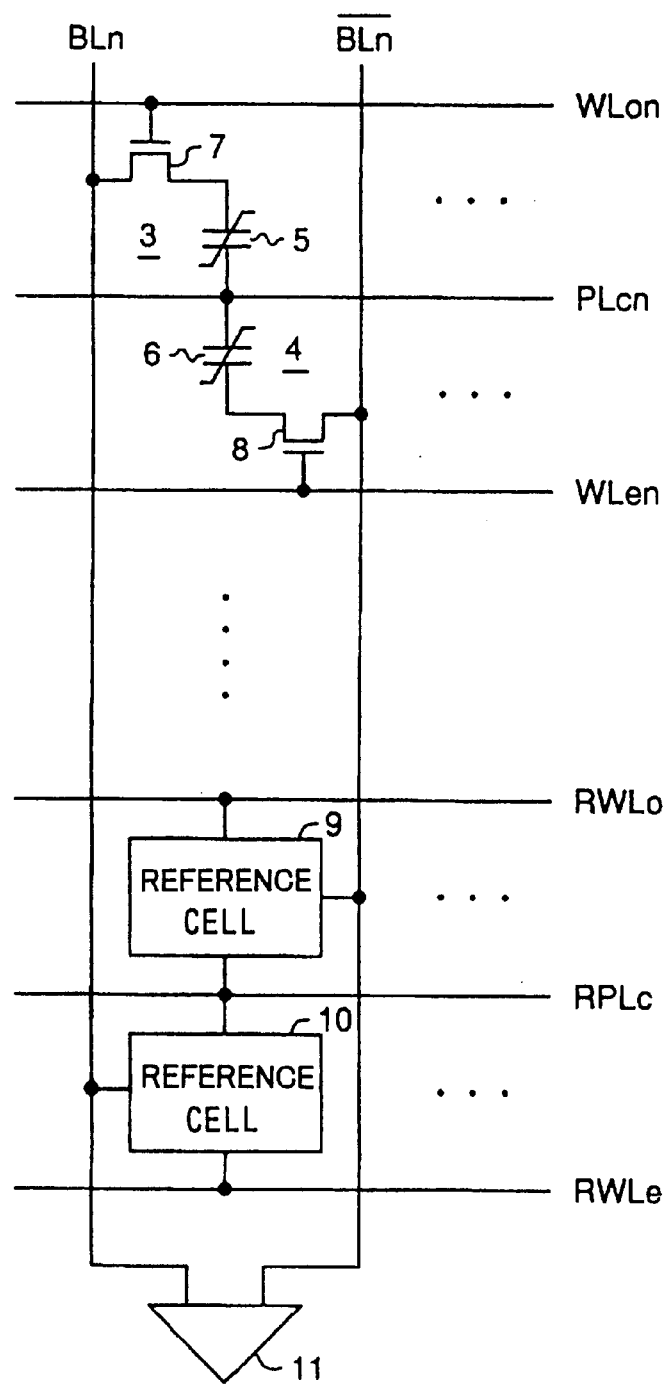
FIG. 4 is a circuit diagram of a part of a memory cell array of a conventional ferroelectric memory equipped with one-transistor/one-capacitor memory cells.
Figure 5:
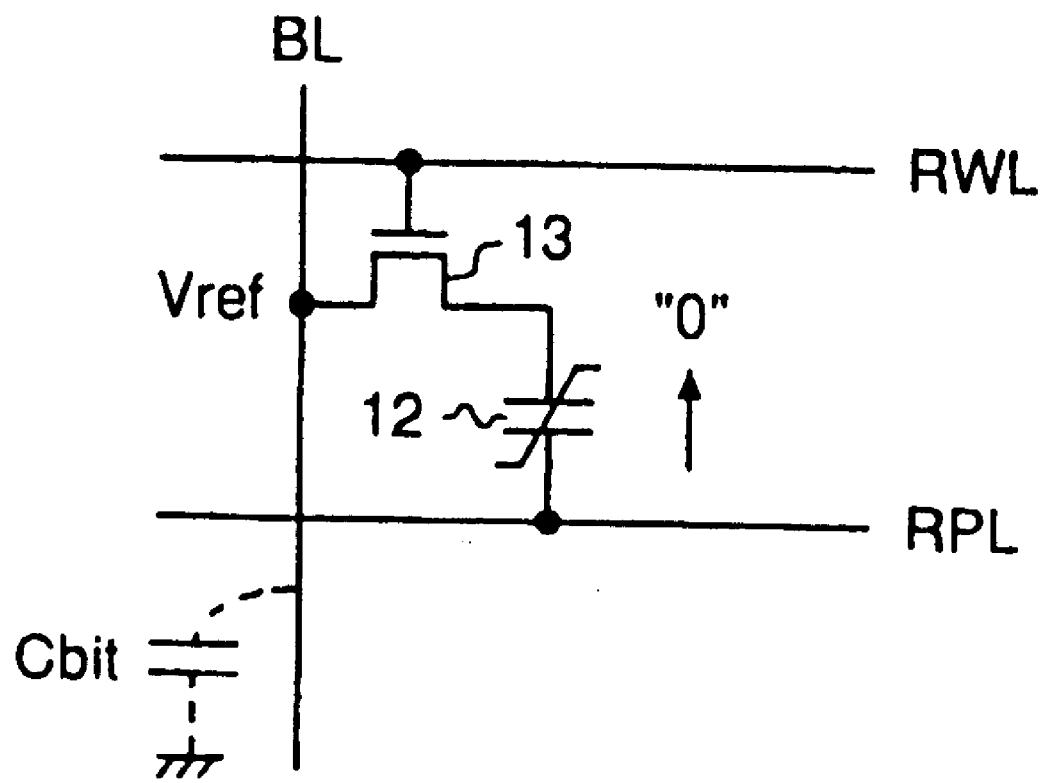
FIG. 5 is a circuit diagram of a configuration of a reference cell.
Figure 6:
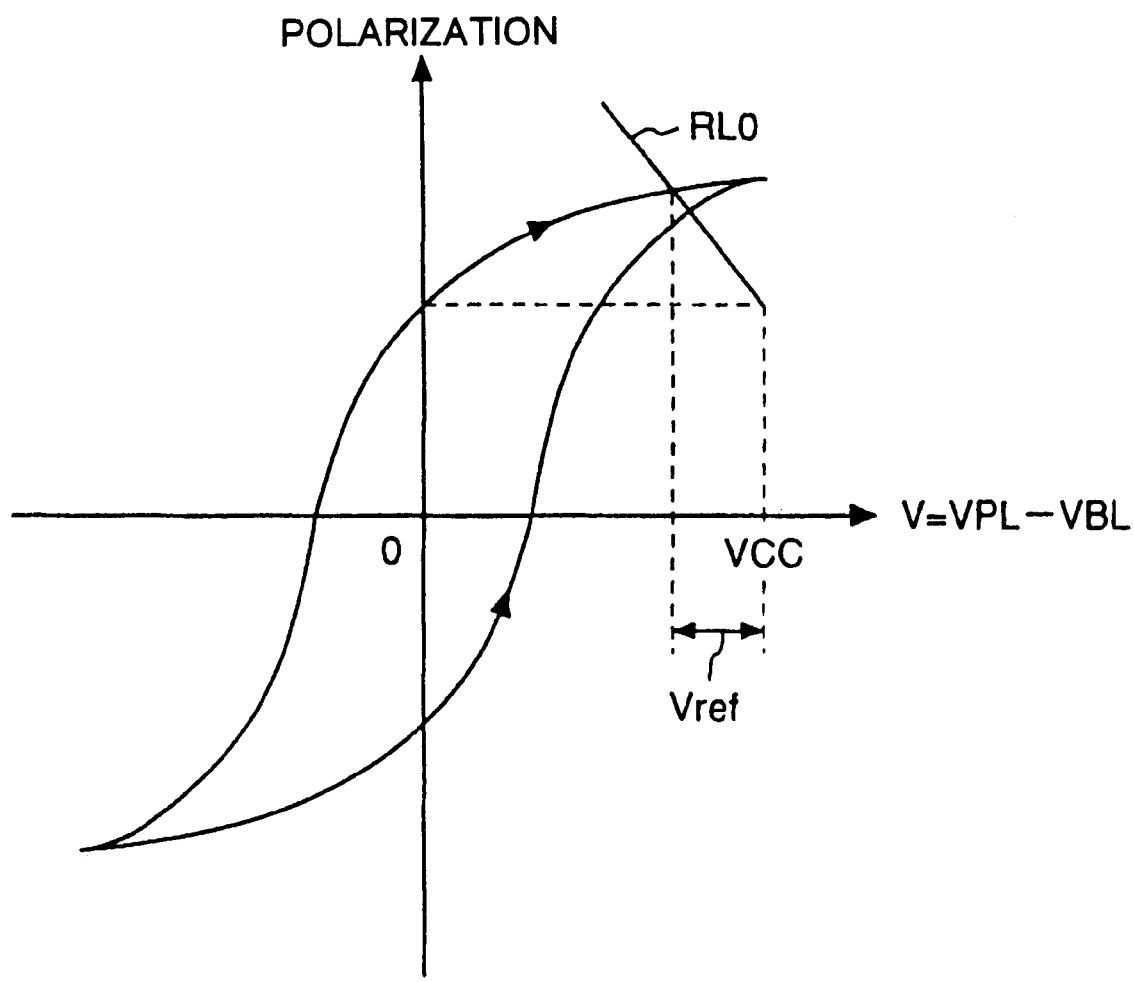
FIG. 6 is a graph of the level of a reference potential generated by the reference cell shown in FIG. 5.
Figure 7:
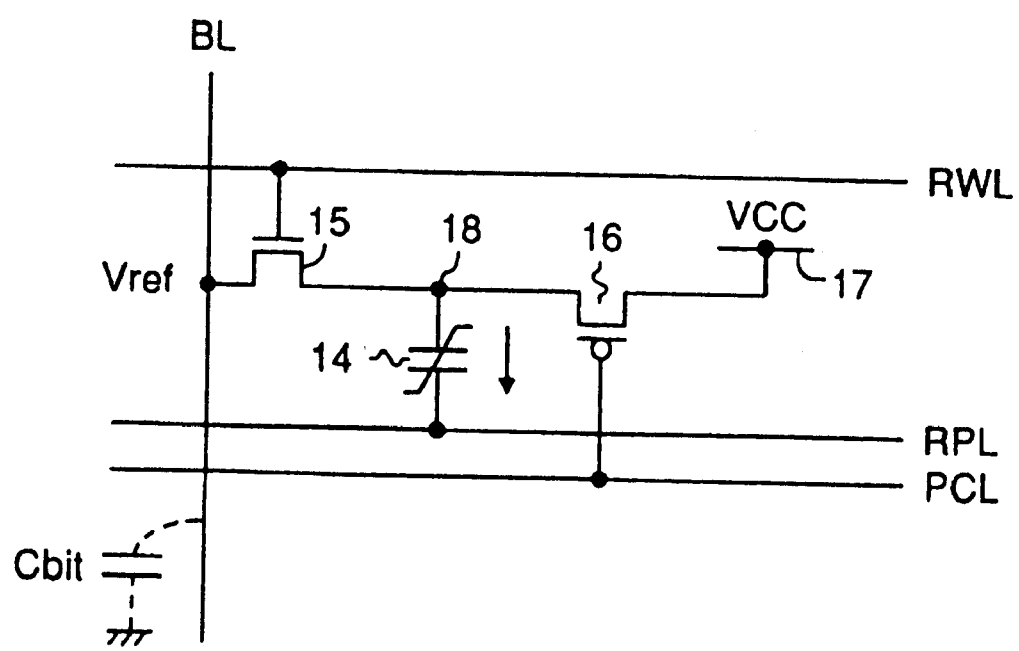
FIG. 7 is a circuit diagram of another configuration of the reference cell.
Figure 8:
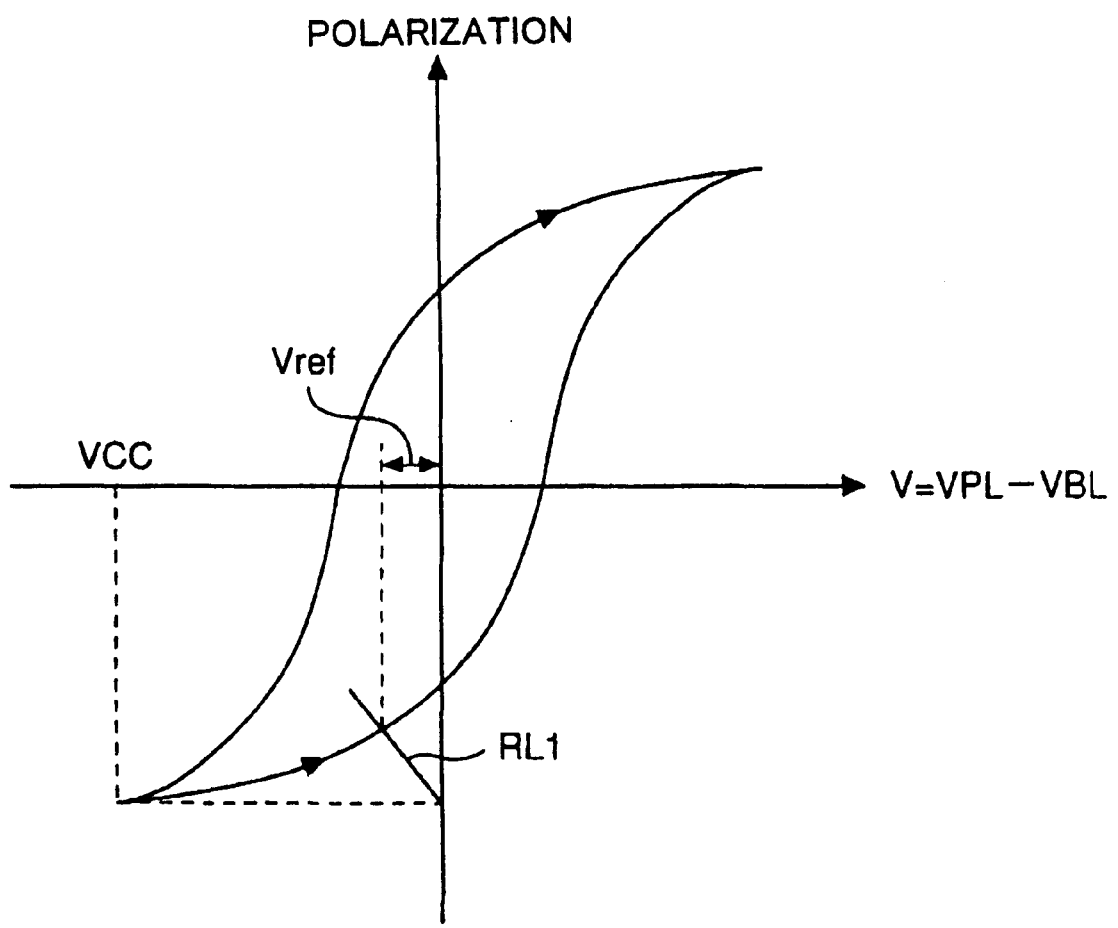
FIG. 8 is a graph of the level of the reference potential generated by the reference cell shown in FIG. 7.
Figure 9:
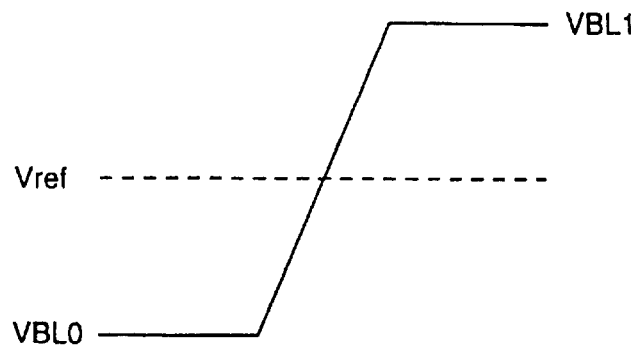
FIG. 9 is a diagram showing a relationship among the reference potential, the bit line potential VBL1 and the bit line potential VBL0.
Figure 10:
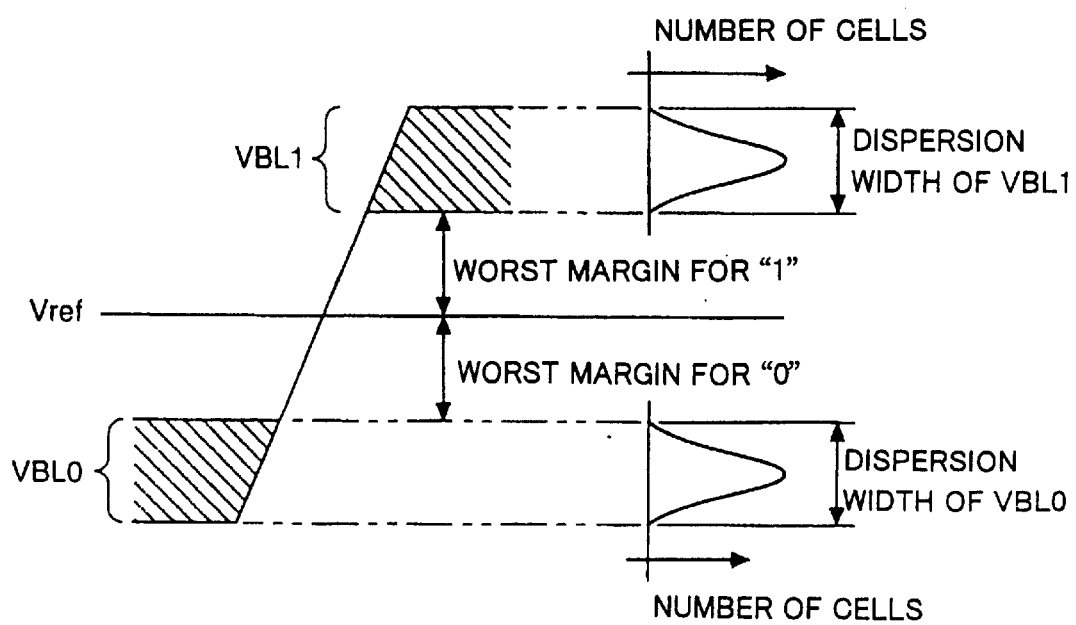
FIG. 10 is a diagram of dispersions of the bit line potentials VBL1 and VBL0.
Figure 11:
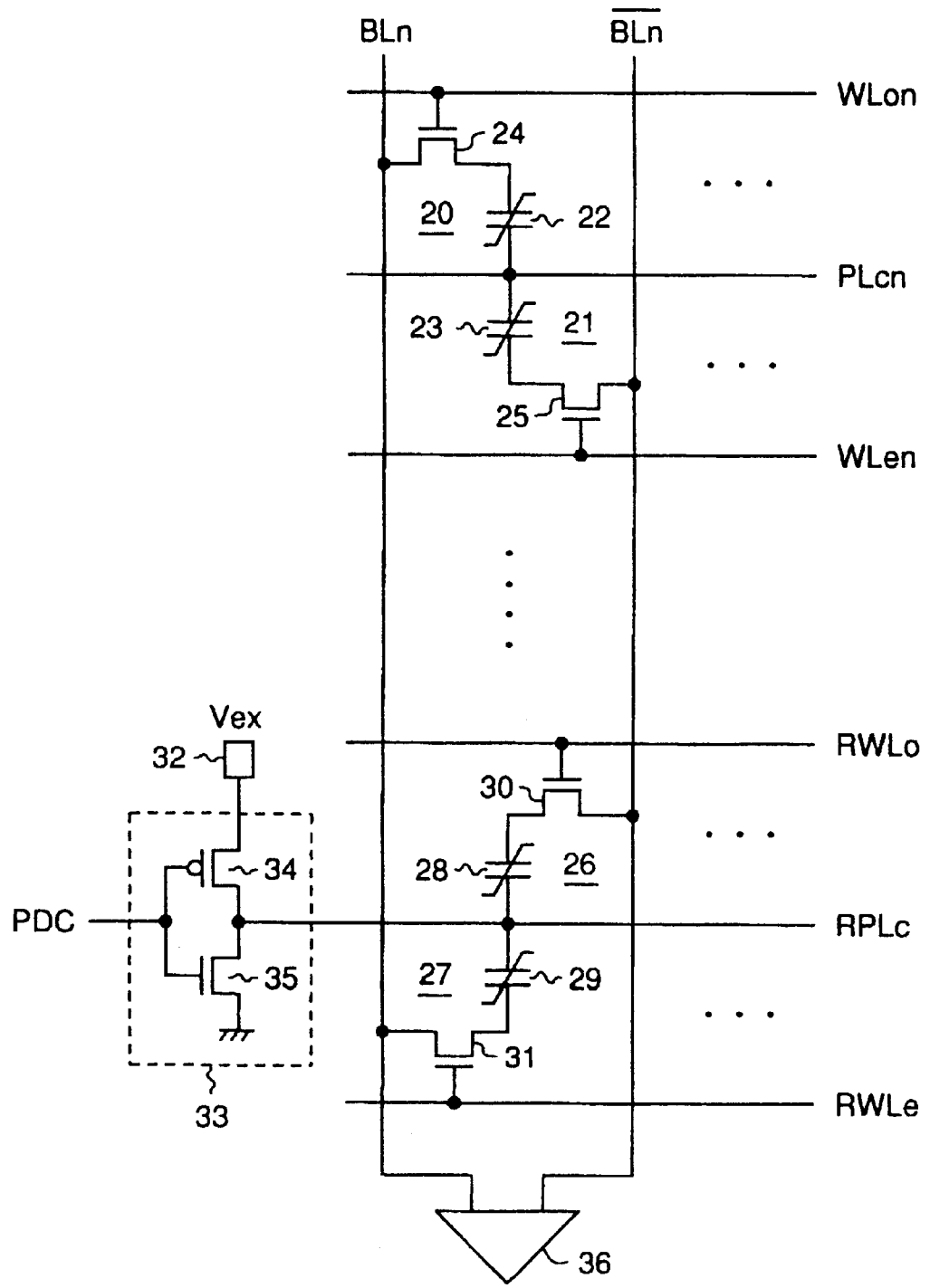
FIG. 11 is a circuit diagram of a ferroelectric memory according to a first embodiment of the present invention.

FIG. 11 is a circuit diagram of a ferroelectric memory according to a first embodiment of the present invention. Referring to FIG. 11, symbols WLon and WEen respectively denote word lines, RPLc denotes a plate line, 26 and 27 indicate reference cells which respectively generate the reference potential Vref, BLn and /BLn respectively denote bit lines, and 20 and 21 respectively indicate memory cells. Further, reference numbers 22 and 23 respectively indicate ferroelectric capacitors, and 24 and 25 respectively indicate nMOS transistors serving as switch elements.

Further, RWLo and WELe respectively denote word lines, RPLc denotes a plate line, 26 and 27 respectively reference cells which respectively generate the reference potential Vref, 28 and 29 respectively indicate ferroelectric capacitors 28 and 29 having a larger area than the ferroelectric capacitors 22 and 23, and 30 and 31 respectively indicate nMOS transistors serving as switch elements.

A reference number 32 indicates a pad to which a control potential Vex for controlling the reference potential Vref from the outside of the circuit shown in FIG. 11 is applied. A reference number 33 indicates a plate line drive circuit which drives the plate line RPLc. The pad 32 and the plate line drive circuit 33 forms a reference potential control circuit.

A reference number 34 indicates a pMOS transistor such as a p-channel insulated gate field effect transistor, which is turned on/off in response to a plate line drive control signal PDC. The source of the pMOS transistor 34 is connected to the pad 32, and the drain thereof is connected to the plate line PLc. A reference number 35 indicates an nMOS transistor such as an n-channel insulated gate field effect transistor, which is turned on/off in response to the plate line drive control signal PDC.

A reference number 36 indicates a sense amplifier, which amplifies the potential difference between the bit lines BL and /BL and thus detects data read to the bit line BL or /BL from the memory cell.

The source of the pMOS transistor 34 is connected to the pad 32 and the source of the nMOS transistor 35 is connected to a ground. The pMOS transistor 34 and the nMOS transistor 35 perform a complementary operation.

In the ferroelectric memory of the first embodiment of the present invention, data read to the bit line BLn from a memory cell located in an odd-numbered row is compared with the reference potential Vref output to the bit line /BLn from the reference cell 26, and is thus detected. Data read to the bit line /BLn from a memory cell located in an even-numbered row is compared with the reference potential Vref output to the bit line BLn from the reference cell 27, and is thus detected.

In the case where the reference potential Vref is output to the bit line /BLn from the reference cell 26, "0" is written into the ferroelectric capacitor 28. In this state, the bit line /BLn is precharged to 0 V, and is set to the high-impedance state. Then, the word line RWLo is selected, and the nMOS transistor 30 is thus turned on. Further, the plate line drive control signal PDC is set to the low level, the pMOS transistor 34 and the nMOS transistors are respectively turned on and off. Hence, the plate line RPLc is set to the control potential Vex from 0 V.

Hence, a charge dependent on the control potential Vex and the magnitude of the remanent polarization in the ferroelectric capacitor 28 is moved to the bit line /BLn from the ferroelectric capacitor 28. Thus, the original charge is divided into parts respectively stored in the ferroelectric capacitor 28 and the parasitic capacitance Cbit of the bit line /BLn, and the reference potential Vref is generated on the bit line /BLn.

In the case where the reference potential ref is output to the bit line BLn from the reference cell 27, "0" is written into the ferroelectric capacitor 29. In this state, the bit line BLn is precharged to 0 V and is set to the high-impedance state. Then, the word line RWLe is selected and the nMOS transistor 31 is thus turned on. Further, the plate line drive control signal PDC is set to the low level, and the pMOS transistor 34 and the nMOS transistor 35 are respectively turned on and off. Thus, the plate line RPLc is set to the control potential Vex from 0 V.

Hence, a charge dependent on the control potential Vex and the magnitude of a remanent polarization in the ferroelectric capacitor 29 is moved to the bit line BLn from the ferroelectric capacitor 29. Thus, the original charge is divided into parts respectively stored in the ferroelectric capacitor 29 and the parasitic capacitor Cbit of the bit line BL. Hence, the reference potential Vref is generated on the bit line BLn.

Figure 12:
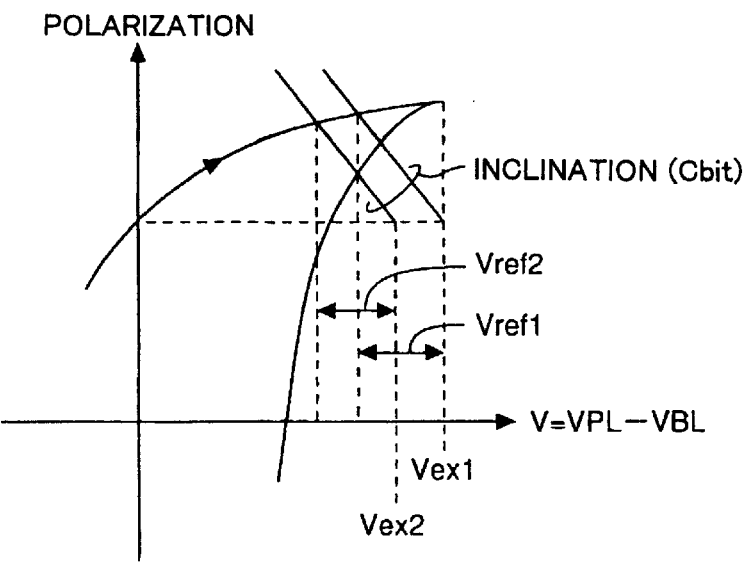
FIG. 12 is a graph showing a relationship between a control potential Vex and a reference potential Vref in the first embodiment of the present invention.
Figure 13:
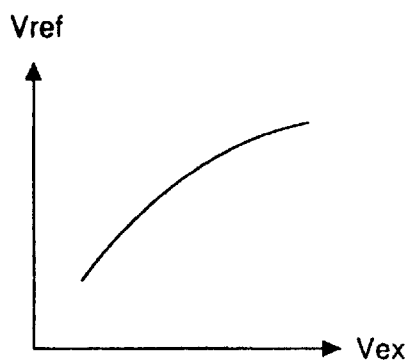
FIG. 13 is another graph showing the relationship between the control potential Vex and the reference potential Vref in the first embodiment of the present invention.

As described above, according to the first embodiment of the present invention, it is possible to change the reference potential Vref by changing the control potential Vex. For example, as shown in FIG. 12, when Vex1>Vex2, then it is possible to make the reference voltage Vref1 higher than the reference voltage Vref2. FIG. 13 shows a relationship between the reference voltage Vref and the control potential Vex.

By changing the control potential Vex for each memory cell, the reference potential Vref is changed. Hence, at the time of reading data, the margins of the potential of the bit line to which the data is read can be inspected.

According to the first embodiment of the present invention, it is possible to detect products of a low reliability from those which have passed a given inspection and prevent the low-reliability products from being shipped. Hence, the shipped products are highly reliable. Further, it is possible to determine whether the products of a low reliability detected by the above have a margin failure or another factor such as a problem in the production process and to efficiently perform the failure analysis.

When the reference potential control circuit made up of the pad 32 and the plate line drive circuit 33 is produced together with the other circuits of the one-transistor/one-capacitor type ferroelectric memory, the margins of the potentials of the bit lines obtained at the time of reading data can be inspected in the state of a wafer after all the circuits are formed thereon.

In the products which have passed the margin inspection as to reading of data to the bit lines, the pad 32 may be connected to the VCC power supply line. Hence, the plate line drive circuit 33 can be used as the regular plate line drive circuit, and the chip area can efficiently be utilized.

A description will now be given of a second embodiment of the present invention.

Figure 14:
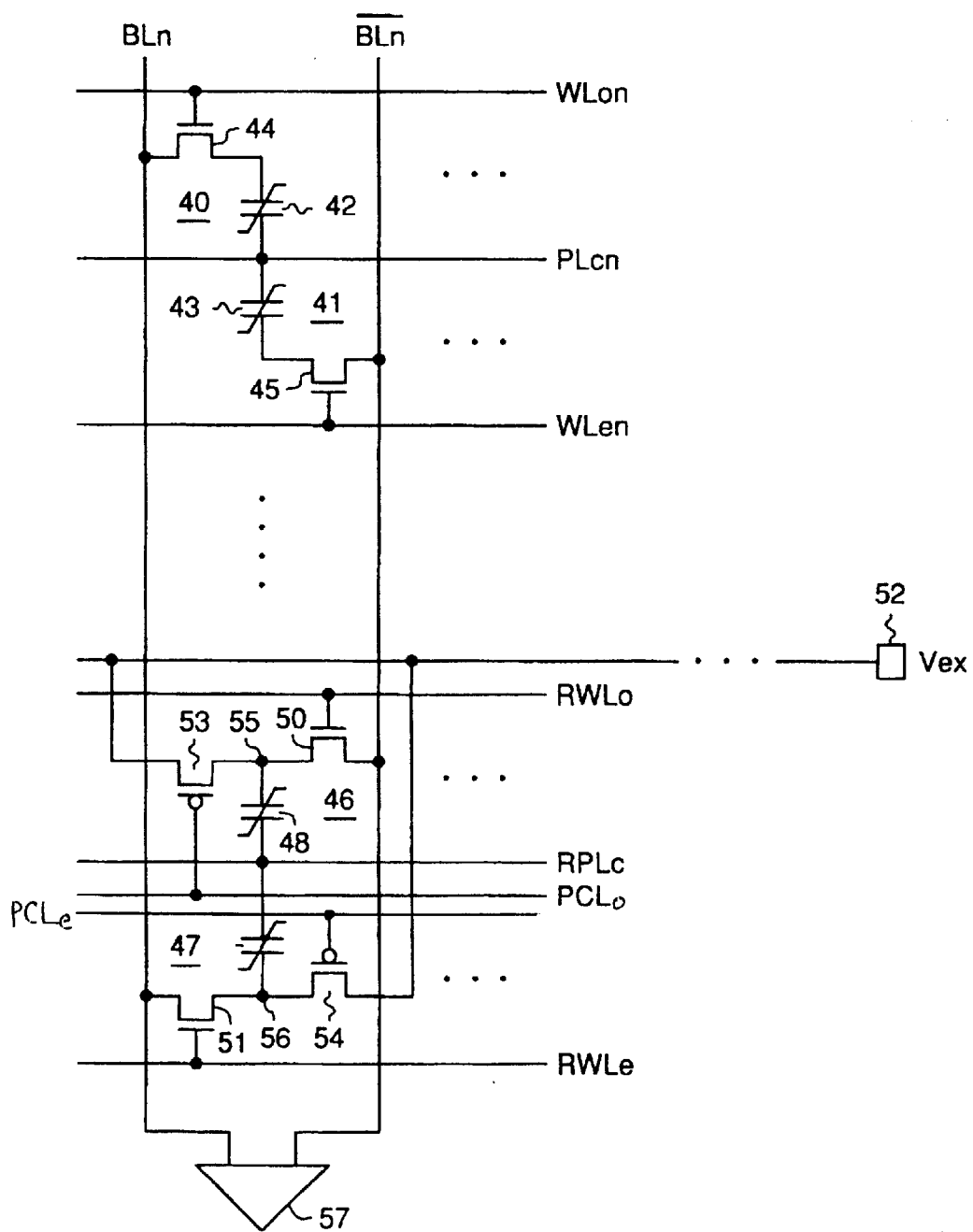
FIG. 14 is a circuit diagram of a ferroelectric memory according to a second embodiment of the present invention.

FIG. 14 is a circuit diagram of a ferroelectric memory according to the second embodiment of the present invention. In FIG. 14, parts and signals that are the same as those shown in the previously described figures are given the same reference numbers. Reference numbers 40 and 41 respectively indicate memory cells, 42 and 43 respectively indicate ferroelectric capacitors serving as recording media, and 44 and 45 respectively indicate nMOS transistors serving as switch elements. Reference numbers 46 and 47 respectively indicate reference cells which respectively output the reference potentials Vref, and 48 and 49 respectively indicate ferroelectric capacitors having a larger area than the ferroelectric capacitors 42 and 43. Reference numbers 50 and 51 respectively indicate nMOS transistors serving as switch elements.

A reference number 52 is a pad to which the control voltage Vex for controlling the reference potentials Vref from the outside of the circuit shown in FIG. 14 is applied. Reference numbers 53 and 54 respectively indicate pMOS transistors forming precharge circuits. The source of the pMOS transistor 53 is connected to the pad 52, and the drain thereof is connected to a node 55. The gate of the pMOS transistor 53 is connected to an odd-numbered precharge control line PCLo. The pMOS transistor 53 is turned on/off in response to the precharge control signal transferred over the precharge control line PCLo.

The source of the pMOS transistor 54 is connected to the pad 52, and the drain thereof is connected to a node 56. The gate of the pMOS transistor 54 is connected to an even-numbered precharge control line PCLe. The pMOS transistor 54 is turned on/off in response to the precharge control signal transferred over the precharge control line PCLe.

The pad 52 and the pMOS transistor 53 form a reference potential control circuit associated with the bit line /BLn. The pad 52 and the pMOS transistor 54 form a reference potential control circuit associated with the bit line BLn.

A reference number 57 is a sense amplifier, which amplifies the potential difference between the bit lines BLn and /BLn and thus detect data read to the bit lines BLn and /BLn from the memory cell.

The data read to the bit line BLn from a memory cell located in an odd-numbered row, such as the memory cell 40, is compared with the reference potential Vref output to the bit line /BLn from the reference cell 46, and is thus detected. The data read from the bit line /BLn from a memory cell located in an even-numbered row, such as the memory cell 40, is compared with the reference potential Vref output to the bit line BLn from the reference cell 47, and is thus detected.

When the reference potential Vref is output to the bit line /BLn from the reference cell 46, the pMOS transistor 53 is maintained in the on state by the precharge control signal transferred over the precharge control line PCLo during the non-selected state. Hence, the node 55 is precharged to the control potential Vex. After the bit line /BLn is precharged to 0 V, it is set to the high-impedance state, and the pMOS transistor 53 is turned off by the precharge control signal transferred over the precharge control line PCLo. Then, the word line RWLo is selected and the nMOS transistor 50 is thus turned on while the plate line RPLc is maintained at 0 V.

As a result, a charge dependent on the control voltage Vex and the magnitude of polarization of the ferroelectric capacitor 48 is moved to the bit line /BLn from the ferroelectric capacitor 48. Thus, the original charge is divided into parts respectively stored in the ferroelectric capacitor 48 and the parasitic capacitor Cbit of the bit line /BLn. Hence, the reference voltage Vref is generated on the bit line /BLn.

When the reference potential Vref is output to the bit line BLn from the reference cell 47, the pMOS transistor 54 is maintained in the on state by the precharge control signal transferred over the precharge control line PCLe for the non-selected state. Then, the node 56 is precharged to the control potential Vex.

In the above state, the bit line BLn is precharged to 0 V, and is set to the high-impedance state. Further, the pMOS transistor 54 is turned off by the precharge control signal transferred over the precharge control line PCLe. The word line RWLe is selected and the nMOS transistor 51 is turned ON while the plate line RPLc is maintained at 0 V.

Hence, a charge dependent on the control voltage Vex and the magnitude of polarization in the ferroelectric capacitor 49 is moved to the bit line BLn from the ferroelectric capacitor 49. That is, the original charge is divided into parts respectively stored in the ferroelectric capacitor 48 and the parasitic capacitor Cbit of the bit line /BLn. Thus, the reference potential Vref is generated on the bit line /BLn.

When the reference voltage Vref is output to the bit line BLn from the reference cell 47, the pMOS transistor 54 is in the on state by the precharge control signal transferred over the precharge control line PCLe. Further, the node 56 is precharged to the control voltage Vex.

The bit line BLn is precharged to 0 V, and is set to the high-impedance state. Further, the pMOS transistor 54 is turned off by the precharge control signal transferred over the precharge control line PCLe. Then, the word line RWLe is selected and the nMOS transistor 51 is turned on while the plate line RPLc is maintained at 0 V.

As a result, a charge dependent on the control voltage Vex and the magnitude of polarization of the ferroelectric capacitor 49 is moved to the bit line BLn from the ferroelectric capacitor 49. Thus, the original charge is divided into parts respectively stored in the ferroelectric capacitor 49 and the parasitic capacitor Cbit of the bit line BLn. Thus, the reference potential is generated on the bit line BLn.

Figure 15:
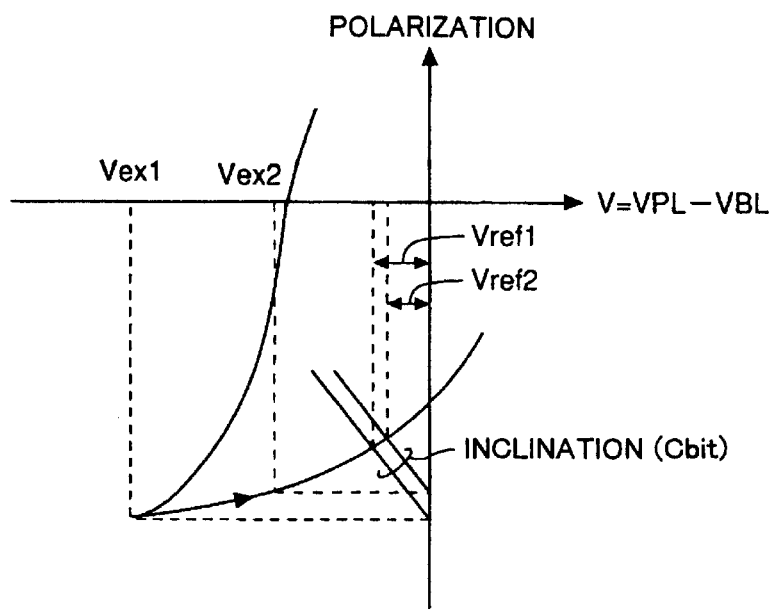
FIG. 15 is a graph showing a relationship between the control potential Vex and the reference potential Vref in the second embodiment of the present invention.
Figure 16:
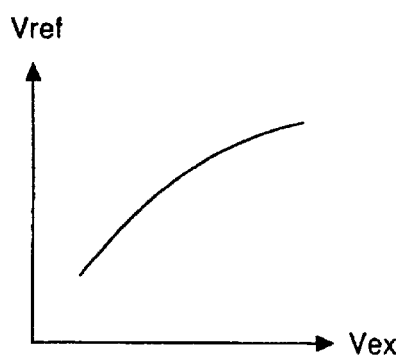
FIG. 16 is another graph showing the relationship between the control potential Vex and the reference potential Vref in the second embodiment of the present invention.

According to the second embodiment of the present invention, the reference voltage Vref can be changed by changing the control voltage Vex. For example, as shown in FIG. 15, when Vex1>Vex2, it is then possible to make the reference voltage Vref1 higher than the reference voltage Vref2. FIG. 16 shows a relationship between the control voltage Vex and the reference voltage Vref.

By changing the control potential Vex for each memory cell, the reference potential Vref is changed. Hence, it is possible to inspect, at the time of reading data, the margins of the potential of the bit line to which the data is read.

According to the second embodiment of the present invention, it is possible to detect products of a low reliability from those which have passed a given inspection and prevent the low-reliability products from being shipped. Hence, the shipped products are highly reliable. Further, it is possible to determine whether the products of a low reliability detected by the above have a margin failure or another factor such as a problem in the production process and to efficiently perform the failure analysis.

When the reference potential control circuits formed by the precharge circuits are produced together with the other circuits of the one-transistor/one-capacitor type ferroelectric memory, the margins of the potentials of the bit lines obtained at the time of reading data can be inspected in the state of a wafer after all the circuits are formed thereon.

In the products which have passed the margin inspection as to reading of data to the bit lines, the pad 52 may be connected to the VCC power supply line. Hence, the precharge circuits functioning as the reference potential control circuits can be used as the regular precharge circuits, and the chip area can efficiently be utilized.

The present invention is not limited to the specifically disclosed embodiments, and variations and modifications may be made without departing from the scope of the present invention.

The present application is based on Japanese priority application no. 10-237860 filed on Aug. 25, 1998, the entire contents of which are hereby incorporated by reference.

What is claimed is:

1. A ferroelectric memory comprising:

first and second bit lines to which memory cells are connected;

a first reference cell which is connected to the second bit line and outputs a reference potential to the second bit line when the memory cells connected to the first bit line are selected;

a second reference cell which is connected to the first bit line and outputs the reference potential to the first bit line when the memory cells connected to the second bit line are selected;

a sense amplifier which amplifies a potential difference between the first and second bit lines and detects data output to one of the first and second bit lines from a selected memory cell; and a reference potential control circuit which controls the first and second reference cells to thereby change the reference potential to an intermediate potential between a power supply voltage and a ground potential.

2. The ferroelectric memory as claimed in claim 1, wherein the reference potential control circuit controls the first and second reference cells in response to a control potential externally applied.

3. The ferroelectric memory as claimed in claim 2, wherein:

the first reference cell comprises a first ferroelectric capacitor having a first electrode connected to a plate line, and a first switch element having one end connected to a second electrode of the first ferroelectric capacitor and another end connected to the second bit line;

the second reference cell comprises a second ferroelectric capacitor having a first electrode connected to the plate line, and a second switch element having one end connected to a second electrode of the first ferroelectric capacitor and another end connected to the first bit line; and the reference potential control circuit comprises a pad to which a control potential is applied, a third switch element having one end connected to the pad and another end connected to the plate line, and a fourth switch element having one end connected to a plate line and another end connected to a ground, the third and fourth switch elements performing a complementary operation.

4. The ferroelectric memory as claimed in claim 3, wherein:

the third switch element comprises a p-channel field effect transistor having a source connected to the pad, a drain connected to the plate line, and a gate to which a plate line control signal is applied; and the fourth switch element comprises an n-channel field effect transistor having a drain connected to the plate line, a source connected to the ground, and a gate to which the plate line control signal is applied.

5. The ferroelectric memory as claimed in claim 2, wherein:

the first reference cell comprises a first ferroelectric capacitor having a first electrode connected to a plate line, and a first switch element having one end connected to a second electrode of the first ferroelectric capacitor and another end connected to the second bit line;

the second reference cell comprises a second ferroelectric capacitor having a first electrode connected to the plate line, and a second switch element having one end connected to a second electrode of the first ferroelectric capacitor and another end connected to the first bit line; and the reference potential control circuit comprises first and second reference potential control circuits, the first reference potential control circuit comprising a pad to which the control potential is applied, and a third switch element which has one end connected to the pad and another end connected to the second electrode of the first ferroelectric capacitor and is controlled by a precharge control signal, the second reference potential control circuit comprising the pad, and a fourth switch element which has one end connected to the pad and another end connected to the second electrode of the second ferroelectric capacitor and is controlled by the precharge control signal.

6. The ferroelectric memory as claimed in claim 5, wherein:

the third switch element comprises a first p-channel field effect transistor which has a source connected to the pad, a drain connected to the second electrode of the first ferroelectric capacitor and is controlled by the precharge control signal; and the fourth switch element comprises a second p-channel field effect transistor which has a source connected to the pad, a drain connected to the second electrode of the second ferroelectric capacitor and is controlled by the precharge control signal.

7. A ferroelectric memory comprising:

memory cells;

a pair of bit lines to which the memory cells are connected; and a control circuit which changes the reference potential of a reference cell to an intermediate potential applied to one of the pair of bit lines while data read from one or the memory cells is output to the other one of the pair of bit lines.

8. The ferroelectric memory as claimed in claim 1, wherein the reference potential control circuit changes the reference potential of a reference cell to an intermediate potential in response to a control signal externally applied.

* * * * *

UNITED STATES PATENT AND TRADEMARK OFFICE
CERTIFICATE OF CORRECTION

PATENT NO. : 6,229,728 B1
DATED : May 8, 2001
INVENTOR(S) : Chikai Ono et al.

It is certified that error appears in the above-identified patent and that said Letters Patent is hereby corrected as shown below:

<u>Title page,</u>
Please change the following:
[73], Assignee, "Fujitu Limited" to -- Fujitsu Limited --

Signed and Sealed this

Twenty-third Day of April, 2002

Attest:

JAMES E. ROGAN
*Director of the United States Patent and Trademark Office*

*Attesting Officer*